United States Patent
Huang et al.

(10) Patent No.: US 9,640,716 B2
(45) Date of Patent: May 2, 2017

(54) MULTIPLE QUANTUM WELL STRUCTURE AND METHOD FOR MANUFACTURING THE SAME

(71) Applicant: Genesis Photonics Inc., Tainan (TW)

(72) Inventors: Chi-Feng Huang, Tainan (TW);
Hsin-Chiao Fang, Tainan (TW);
Chi-Hao Cheng, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/811,821

(22) Filed: Jul. 28, 2015

(65) Prior Publication Data

US 2017/0033260 A1   Feb. 2, 2017

(51) Int. Cl.
*H01L 33/06* (2010.01)
*H01L 33/00* (2010.01)
*H01L 33/32* (2010.01)

(52) U.S. Cl.
CPC ............ *H01L 33/06* (2013.01); *H01L 33/002* (2013.01); *H01L 33/0075* (2013.01); *H01L 33/32* (2013.01)

(58) Field of Classification Search
CPC ... H01L 33/002; H01L 33/0025; H01L 33/06; H01L 33/30; H01L 33/32
See application file for complete search history.

(56) References Cited

U.S. PATENT DOCUMENTS

| | | |
|---|---|---|
| 4,819,036 A | 4/1989 | Kuroda et al. |
| 5,153,687 A | 10/1992 | Ishikawa et al. |
| 5,521,396 A | 5/1996 | Shakuda |
| 2002/0053676 A1 | 5/2002 | Kozaki |
| 2005/0199903 A1* | 9/2005 | Kyono .................. B82Y 20/00 257/103 |
| 2008/0149917 A1* | 6/2008 | Park ...................... B82Y 20/00 257/17 |
| 2010/0150194 A1* | 6/2010 | Tsuchiya ............... B82Y 20/00 372/45.01 |
| 2010/0301523 A1 | 12/2010 | Gillet et al. |

(Continued)

FOREIGN PATENT DOCUMENTS

| | | |
|---|---|---|
| CN | 102368519 | 3/2012 |
| TW | 201133925 | 10/2011 |

OTHER PUBLICATIONS

"Office Action of U.S. Related Application", issued on May 5, 2014, p. 1-p. 16.

(Continued)

*Primary Examiner* — Bryan Junge
(74) *Attorney, Agent, or Firm* — Jianq Chyun IP Office

(57) ABSTRACT

A multiple quantum well structure includes a plurality of well-barrier sets arranged along a direction. Each of the well-barrier sets includes a barrier layer, at least one intermediate level layer, and a well layer. A bandgap of the barrier layer is greater than an average bandgap of the intermediate level layer, and the average bandgap of the intermediate level layer is greater than a bandgap of the well layer. The barrier layers, the intermediate level layers, and the well layers of the well-barrier sets are stacked by turns. Thicknesses of at least parts of the well layers in the direction gradually decrease along the direction, and thicknesses of at least parts of the intermediate level layers in the direction gradually increase along the direction. A method for manufacturing a multiple quantum well structure is also provided.

38 Claims, 7 Drawing Sheets

(56) References Cited

U.S. PATENT DOCUMENTS

| | | | |
|---|---|---|---|
| 2011/0014002 A1 | 1/2011 | Storch et al. | |
| 2011/0037049 A1* | 2/2011 | Tachibana | H01L 33/06 257/13 |
| 2011/0089399 A1* | 4/2011 | Chakraborty | H01L 33/06 257/13 |
| 2011/0187294 A1 | 8/2011 | Bergmann et al. | |
| 2011/0204394 A1* | 8/2011 | Hikosaka | H01L 33/06 257/94 |
| 2014/0034902 A1* | 2/2014 | Hwang | H01L 33/14 257/13 |
| 2014/0084242 A1* | 3/2014 | Okuno | H01L 33/32 257/13 |

OTHER PUBLICATIONS

"Office Action of U.S. Related Application", issued on Nov. 24, 2014, p. 1-p. 20.

"Office Action of U.S. Related Application", issued on Mar. 20, 2015, p. 1-p. 25.

"Office Action of U.S. Related Application", issued on Oct. 19, 2015, p. 1-p. 23.

Michael J. Hamp, et al., "Effect of Barrier Thickness on the Carrier Distribution in Asymmetric Multiple-Quantum-Well InGaAsP Lasers," Photonics Technology Letters, IEEE, IEEE, vol. 12, No. 2, Feb. 2000, pp. 134-pp. 136.

Michael J. Hamp, et al., "Effect of Barrier Height on the Uneven Carrier Distribution in Asymmetric Multiple-Quantum-Well InGaAsP Lasers," Photonics Technology Letters, IEEE, IEEE, vol. 10, No. 10, Oct. 1998, pp. 1380-pp. 1382.

Hamp et al, "Analysis of two asymmetric multiquantum well InGaAsP laser structures," Summaries of papers presented at the Conference on Lasers and Electro-Optics, 1998, pp. 236-237.

Ohno et al., "Nano- and Micromaterials," Springer Berlin Heidelberg, 2008, pp. 264-265.

"Office Action of China Related Application No. 201210359774.4," issued on Dec. 10, 2015, p. 1-p. 5.

\* cited by examiner

MULTIPLE QUANTUM WELL STRUCTURE AND METHOD FOR MANUFACTURING THE SAME

BACKGROUND OF THE INVENTION

Field of the Invention

The invention relates to a quantum well structure and a method for manufacturing the same, and more particularly, to a multiple quantum well structure and a method for manufacturing the same.

Description of Related Art

When material dimensions are reduced to nanometer scale, not only the dimensions are considerably miniaturized, but also some quantum effects such as confinement effects, surface and interface effects, and tunneling effects become particularly apparent. These characteristics may be applied to electronic component development, biochip fabrication, sensitivity enhancement of medical instruments, and so on.

More specifically, due to particle and wave nature of electrons, in a nanomaterial, a length of an electron wave function is close to a feature size of a quantum structure, and the wave nature of electrons is sufficiently shown. Therefore, when a material is reduced to nanometer scale in a direction, the quantum confinement effect will appear in the direction. At this moment, the electrons are confined to move freely in a two-dimensional space constituted by the other two dimensions, and such system is called a quantum well. The quantum well utilizes a semiconductor layer having a larger band gap as a barrier layer and a semiconductor layer having a smaller band gap as a well layer. In the quantum well, which is a well-like band structure formed by the well layer clamped by the barrier layers from two sides, carriers are easily confined, thus enhancing light emission efficiency.

During fabrication of the quantum well, a heterostructure is usually grown, for example, gallium nitride (GaN) and indium gallium nitride (InGaN) multiple quantum well structures are grown. When lattices of two grown heterostructure materials do not match each other, stress will accumulate in the structure. As growing thickness increases, the accumulated stress increases. When the stress exceeds a threshold value, the material layers cannot bear the stress anymore and the stress has to be released in other ways. Accordingly, epitaxial defects are usually caused, leading to damage to the multiple quantum well structure, and further decreasing the light emission efficiency.

SUMMARY OF THE INVENTION

The invention provides a multiple quantum well structure having both good epitaxial quality and a good optical property.

The invention provides a method for manufacturing a multiple quantum well structure, which may manufacture a multiple quantum well structure having both good epitaxial quality and a good optical property.

An embodiment of the invention provides a multiple quantum well structure including a plurality of well-barrier sets arranged along a direction. Each of the well-barrier sets includes a barrier layer, at least one intermediate level layer, and a well layer. The intermediate level layer is beside the barrier layer, and the well layer is beside the intermediate level layer. A bandgap of the barrier layer is greater than an average bandgap of the intermediate level layer, and the average bandgap of the intermediate level layer is greater than a bandgap of the well layer. The barrier layers, the intermediate level layers, and the well layers of the well-barrier sets are stacked by turns. Thicknesses of at least parts of the well layers in the direction gradually decrease along the direction, and thicknesses of at least parts of the intermediate level layers in the direction gradually increase along the direction.

An embodiment of the invention provides a multiple quantum well structure including a plurality of well-barrier sets arranged along a direction. Each of the well-barrier sets includes a barrier layer, at least one intermediate level layer, and a well layer. The intermediate level layer is beside the barrier layer. The well layer is beside the intermediate level layer. A bandgap of the barrier layer is greater than an average bandgap of the intermediate level layer, and the average bandgap of the intermediate level layer is greater than a bandgap of the well layer. The barrier layers, the intermediate level layers, and the well layers of the well-barrier sets are stacked by turns. At least parts of the well-barrier sets are grouped into a plurality of groups, and each of the groups includes a plurality of adjacent well-barrier sets. Thicknesses of the well layers in the direction in the same group are substantially the same, and thicknesses of the well layers in the direction in different groups gradually decrease along the direction. Thicknesses of the intermediate level layers in the direction in the same group are substantially the same, and thicknesses of the intermediate level layers in the direction in different groups gradually increase along the direction.

An embodiment of the invention provides a method for manufacturing a multiple quantum well structure. The method for manufacturing the multiple quantum well structure includes forming a plurality of well-barrier sets, wherein the formed well-barrier sets are arranged along a direction. Forming each of the well-barrier sets includes: forming a barrier layer; forming at least one intermediate level layer; and forming a well layer. The formed intermediate level layer is beside the formed barrier layer, and the formed well layer is beside the formed intermediate level layer. A bandgap of the barrier layer is greater than an average bandgap of the intermediate level layer, and the average bandgap of the intermediate level layer is greater than a bandgap of the well layer. The barrier layers, the intermediate level layers, and the well layers of the well-barrier sets are stacked by turns. Thicknesses of at least parts of the well layers in the direction gradually decrease along the direction, and thicknesses of at least parts of the intermediate level layers in the direction gradually increase along the direction.

Based on the above, in the multiple quantum well structure and the method for manufacturing the multiple quantum well structure according to the embodiments of the invention, thicknesses of at least parts of the well layers in the direction gradually decrease along the direction and thicknesses of at least parts of the intermediate level layers in the direction gradually increase along the direction, or thicknesses of the well layers in the direction in different groups gradually decrease along the direction and thicknesses of the intermediate level layers in the direction in different groups gradually increase along the direction. As a result, the stress accumulated in the multiple quantum well structure is reduced, and the wavelength of light emitted from different well-barrier sets is similar or the same. Therefore, the multiple quantum well structure has both good epitaxial quality and a good optical property.

To make the aforementioned features and advantages of the invention more comprehensible, embodiments accompanied with figures are described in detail below.

DESCRIPTION OF EMBODIMENTS

Figure 1A:
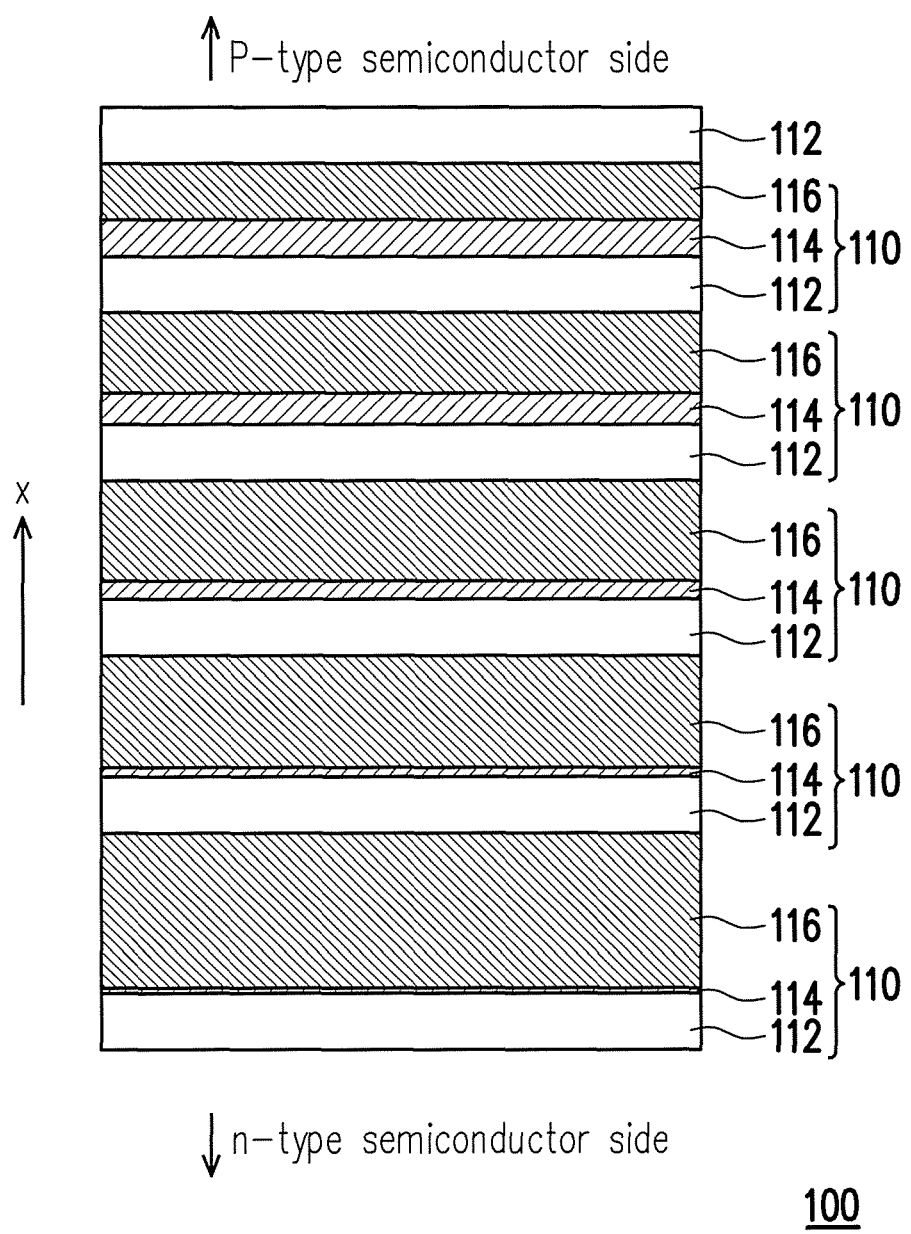
FIG. 1A is a schematic structural view of a multiple quantum well structure according to an embodiment of the invention.
Figure 1B:
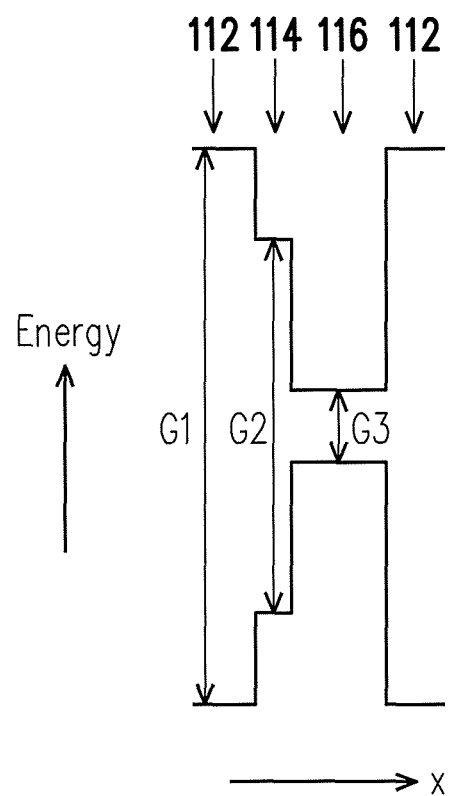
FIG. 1B is a band diagram corresponding to a well-barrier set of the multiple quantum well structure in FIG. 1A.

FIG. 1A is a schematic structural view of a multiple quantum well structure according to an embodiment of the invention. FIG. 1B is a band diagram corresponding to a well-barrier set of the multiple quantum well structure in FIG. 1A. Referring to FIGS. 1A and 1B, a multiple quantum well structure 100 in this embodiment includes a plurality of well-barrier sets 110 arranged along a direction x. Each of the well-barrier sets 110 includes a barrier layer 112, at least one intermediate level layer 114, and a well layer 116. The intermediate level layer 114 is beside the barrier layer 112, and the well layer 116 is beside the intermediate level layer 114. A bandgap G1 of the barrier layer 112 is greater than an average bandgap G2 of the intermediate level layer 114, and the average bandgap G2 of the intermediate level layer 114 is greater than a bandgap G3 of the well layer 116. The barrier layers 112, the intermediate level layers 114, and the well layers 116 of the well-barrier sets 110 are stacked by turns.

Thicknesses of at least parts of the well layers 116 in the direction x gradually decrease along the direction x, and thicknesses of at least parts of the intermediate level layers 114 in the direction x gradually increase along the direction x. In this embodiment, the thicknesses of all the well layers 116 in the direction x gradually decrease along the direction x, and the thicknesses of all the intermediate level layers 114 in the direction x gradually increase along the direction x. However, in some other embodiments, thicknesses of only parts of the well layers 116 in the direction x gradually decrease along the direction x, and thicknesses of only parts of the intermediate level layers 114 in the direction x gradually increase along the direction x.

In this embodiment, an n-type semiconductor layer (at the n-type semiconductor side in FIG. 1A) and a p-type semiconductor layer (at the p-type semiconductor side in FIG. 1A) are respectively disposed at two opposite sides of the well-barrier sets 110, and the direction x is from the n-type semiconductor layer to the p-type semiconductor layer. However, in some other embodiment, the direction x may be from the p-type semiconductor layer to the n-type semiconductor layer.

In this embodiment, the barrier layer 112 is made of a binary compound (e.g. gallium nitride (GaN)), both the intermediate level layer 114 and the well layer 116 are made of ternary compounds (e.g. indium gallium nitride (InGaN)), each of the ternary compounds has an element (e.g. indium) which the binary compound does not have, the mole fraction of the element (e.g. indium) in the at least parts of the well layers 116 gradually increases along the direction x, and the mole fraction of the element (e.g. indium) in the at least parts of the intermediate level layers 114 gradually decreases along the direction x. In this embodiment, the mole fraction of the element (e.g. indium) in all the well layers 116 gradually increases along the direction x, and the mole fraction of the element (e.g. indium) in all the intermediate level layers 114 gradually decreases along the direction x. However, in some other embodiments, the mole fraction of the element (e.g. indium) in only parts of the well layers 116 gradually increases along the direction x, and the mole fraction of the element (e.g. indium) in only parts of the intermediate level layers 114 gradually decreases along the direction x.

In this embodiment, in each of the well-barrier sets 110, the mole fraction of the element (e.g. indium) in the well layer 116 is greater than the mole fraction of the element (e.g. indium) in the intermediate level layer 114. In this embodiment, the thickness of the intermediate level layer 114 plus the thickness of the well layer 116 in each of the well-barrier sets 110 is substantially the same.

In addition, in this embodiment, the thickness of the intermediate level layer 114 plus the thickness of the well layer 116 in each of the well-barrier sets 110 is greater than 1 nanometer (nm) and less than 5 nm. Moreover, in this embodiment, the number of the well-barrier sets is greater than 2 and less than 20. Besides, in this embodiment, in each of the well-barrier sets, the thickness of the well layer 116 is greater than the thickness of the intermediate level layer 114.

For example, the multiple quantum well structure 100 has k well-barrier sets, where k is, for example, an integer greater than 2 and less than 20. The thicknesses of the well layers 116 from the n-type semiconductor side to the p-type semiconductor side are, for example, $Lx1, Lx2, \ldots$ and $Lxk$, respectively. The thicknesses of the intermediate level layers 114 from the n-type semiconductor side to the p-type semiconductor side are, for example, $Ly1, Ly2, \ldots$, and $Lyk$, respectively. The mole fractions of indium of the well layers 116 from the n-type semiconductor side to the p-type semiconductor side are, for example, $x1, x2, \ldots$, and $xk$, respectively. The mole fractions of indium of the intermediate level layers 114 from the n-type semiconductor side to the p-type semiconductor side are, for example, $y1, y2, \ldots$, and $yk$, respectively. In this embodiment, the multiple quantum well structure 100 may satisfy at least one of the following conditions:

$Lx1 > Lx2 > \ldots > Lxk$;

$Ly1 < Ly2 < \ldots < Lyk$;

$0 < x1 < x2 < \ldots < xk < 1$;

$1 > y1 > y2 > \ldots > yk > 0$;

$5 \text{ nm} > Lx1 + Ly1 = Lx2 + Ly2 = \ldots = Lxk + Lyk > 1 \text{ nm}$;

$Lx1 > Ly1, Lx2 > Ly2, \ldots$, and $Lxk > Lyk$; and $x1 > y1, x2 > y2, \ldots$, and $xk > yk$.

In the multiple quantum well structure 100 in this embodiment, the thicknesses of at least parts of the well layers 116 in the direction x gradually decrease along the direction x and the thicknesses of at least parts of the intermediate level layers 114 in the direction x gradually increase along the direction x. As a result, the stress accumulated in the multiple quantum well structure 100 is reduced, and the wavelength of light emitted from different well-barrier sets 100 is similar or the same. Therefore, the multiple quantum well structure 100 has both good epitaxial quality and a good optical property. Specifically, the wavelength of light emitted by the well-barrier set 100 depends on the width and depth of the well. Therefore, when the thicknesses of at least parts of the well layers 116 in the direction x gradually decrease along the direction x and the thicknesses of at least parts of the intermediate level layers 114 in the direction x gradually increase along the direction x, and when the mole fraction of the element (e.g. indium) in the at least parts of the intermediate level layers 114 gradually decreases along the direction x, the wavelength of light emitted from different well-barrier sets 100 is similar or the same.

In this embodiment, the thicknesses of all the barrier layers 112 in the multiple quantum well structure 100 are substantially the same. However, in some other embodiments, the thicknesses of at least parts of the barrier layers 112 may increase or decrease along the direction x. Moreover, in this embodiment, the multiple quantum well structure 100 may further include a barrier layer 112 disposed on the last (e.g. topmost) well-barrier set 110, e.g. on the well layer 116 of the last well-barrier set 110.

Figure 2A:
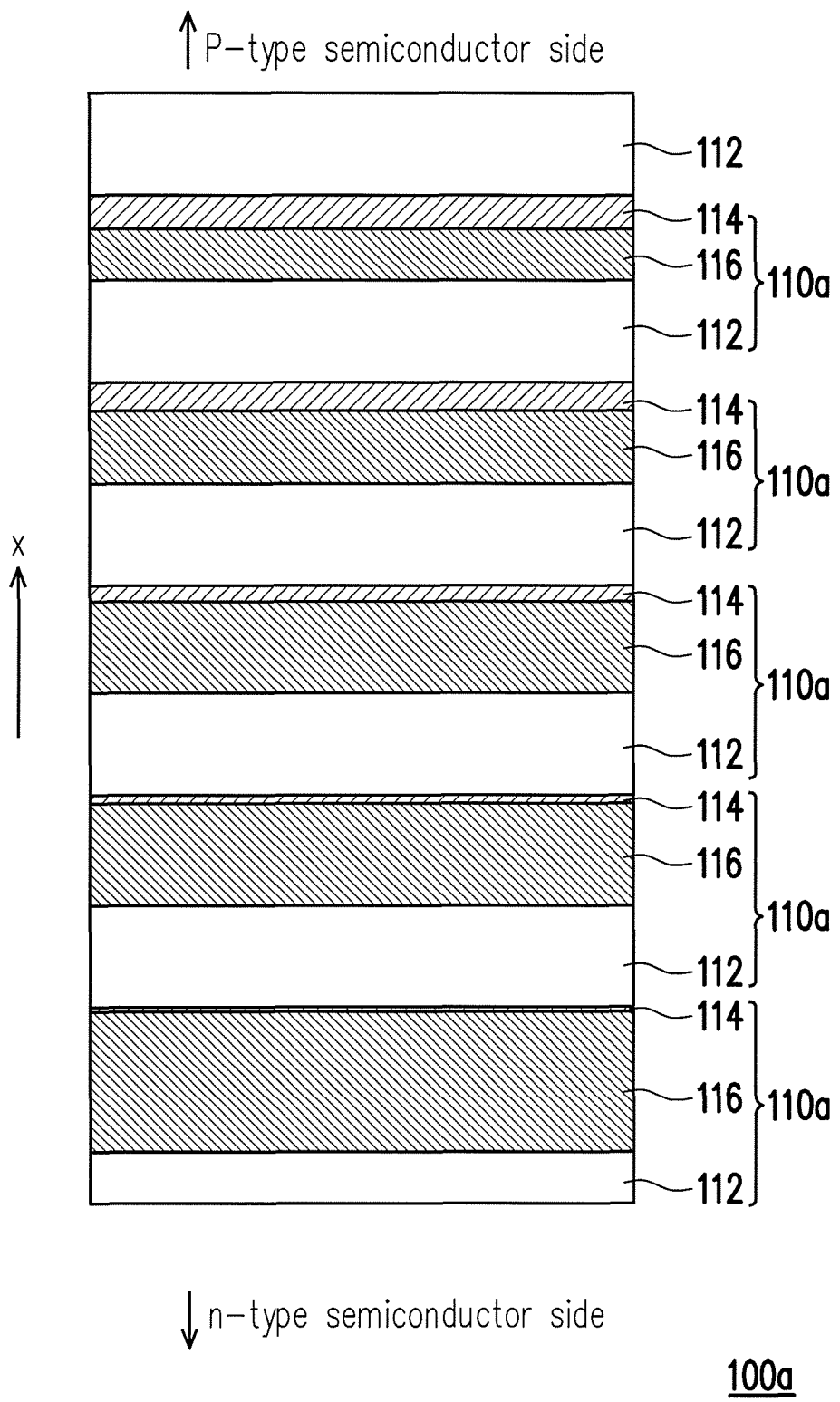
FIG. 2A is a schematic structural view of a multiple quantum well structure according to another embodiment of the invention.
Figure 2B:
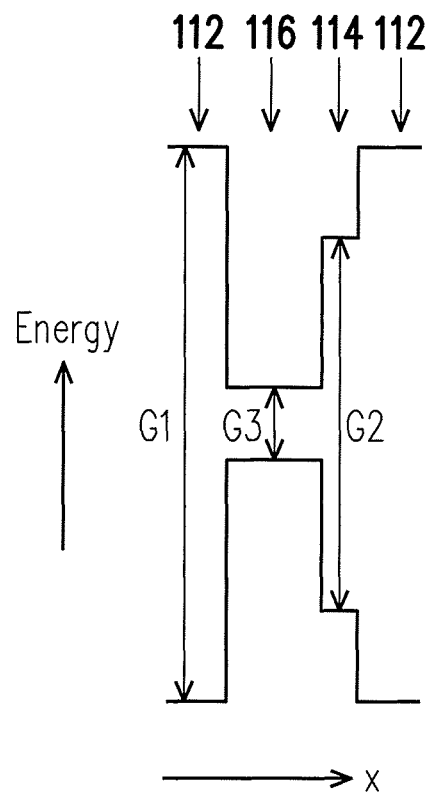
FIG. 2B is a band diagram corresponding to the multiple quantum well structure in FIG. 2A.

FIG. 2A is a schematic structural view of a multiple quantum well structure according to another embodiment of the invention. FIG. 2B is a band diagram corresponding to the multiple quantum well structure in FIG. 2A. Referring to FIGS. 2A and 2B, the multiple quantum well structure 100a in this embodiment is similar to the multiple quantum well structure 100 in FIG. 1A, and the difference therebetween is as follows. In each well-barrier set 110 of the multiple quantum well structure 100 in FIG. 1A, the intermediate level layer 114 is disposed between the barrier layer 112 and the well layer 116; that is, the barrier layer 112, the intermediate level layer 114, and the well layer 116 are arranged along the direction x in sequence. However, in each well-barrier set 110a of the multiple quantum well structure 100a in this embodiment, the well layer 116 is disposed between the barrier layer 112 and the intermediate level layer 114; that is, the barrier layer 112, the well layer 116, and the intermediate level layer 114 are arranged along the direction x in sequence.

Similar to the multiple quantum well structure 100 in FIG. 1A, the multiple quantum well structure 100a in this embodiment may also satisfy at least one of the following conditions:

$Lx1 > Lx2 > \ldots > Lxk;$ $Ly1 < Ly2 < \ldots < Lyk;$ $0 < x1 < x2 < \ldots < xk < 1;$ $1 > y1 > y2 > \ldots > yk > 0;$ $5 \text{ nm} > Lx1 + Ly1 = Lx2 + Ly2 = \ldots = Lxk + Lyk > 1 \text{ nm};$ $Lx1 > Ly1, Lx2 > Ly2, \ldots, \text{ and } Lxk > Lyk;$ and $x1 > y1, x2 > y2, \ldots, \text{ and } xk > yk,$ where the multiple quantum well structure 100a has k well-barrier sets, where k is, for example, an integer greater than 2 and less than 20; the thicknesses of the well layers 116 from the n-type semiconductor side to the p-type semiconductor side are, for example, $Lx1, Lx2, \ldots$ and $Lxk$, respectively; the thicknesses of the intermediate level layers 114 from the n-type semiconductor side to the p-type semiconductor side are, for example, $Ly1, Ly2, \ldots,$ and $Lyk$, respectively; the mole fractions of indium of the well layers 116 from the n-type semiconductor side to the p-type semiconductor side are, for example, $x1, x2, \ldots,$ and $xk$, respectively; the mole fractions of indium of the intermediate level layers 114 from the n-type semiconductor side to the p-type semiconductor side are, for example, $y1, y2, \ldots,$ and $yk$, respectively.

Referring to FIGS. 1A and 1B again, in an embodiment, the barrier layer 112 is made of a binary compound (e.g. GaN), the well layer 116 is made of a ternary compound (e.g. InGaN), and the intermediate level layer is made of a quaternary compound (e.g. indium aluminum gallium nitride (InAlGaN)). Each of the ternary compound (e.g. InGaN) and the quaternary compound (e.g. InAlGaN) has a first element (e.g. indium) which the binary compound (e.g. GaN) does not have. The mole fraction of the first element (e.g. indium) in the at least parts of the well layers 116 gradually increases along the direction x, and the mole fraction of the first element (e.g. indium) in the at least parts of the intermediate level layers 114 gradually decreases along the direction x. In this embodiment, the mole fraction of the first element (e.g. indium) in all the well layers 116 gradually increases along the direction x, and the mole fraction of the first element (e.g. indium) in all the intermediate level layers 114 gradually decreases along the direction x. However, in some other embodiments, the mole fraction of the first element (e.g. indium) in only parts of the well layers 116 gradually increases along the direction x, and the mole fraction of the first element (e.g. indium) in only parts of the intermediate level layers 114 gradually decreases along the direction x.

In this embodiment, the quaternary compound (e.g. InAlGaN) has a second element (e.g. aluminum) which both the binary compound (e.g. GaN) and the ternary compound (e.g. InGaN) do not have, and the mole fraction of the second element (e.g. aluminum) in the at least parts of the intermediate level layers 114 gradually decreases along the direction x. In this embodiment, the mole fraction of the second element (e.g. aluminum) in all the intermediate level layers 114 gradually decreases along the direction x. However, in some embodiments, the mole fraction of the second element (e.g. aluminum) in only parts of the intermediate level layers 114 gradually decreases along the direction x.

For example, the multiple quantum well structure 100 has k well-barrier sets, where k is, for example, an integer greater than 2 and less than 20. The thicknesses of the well layers 116 from the n-type semiconductor side to the p-type semiconductor side are, for example, $Lx1, Lx2, \ldots$ and $Lxk$, respectively. The thicknesses of the intermediate level layers 114 from the n-type semiconductor side to the p-type semiconductor side are, for example, $Ly1, Ly2, \ldots,$ and $Lyk$, respectively. The mole fractions of indium of the well layers 116 from the n-type semiconductor side to the p-type semiconductor side are, for example, $x1, x2, \ldots,$ and $xk$, respectively. The mole fractions of indium of the intermediate level layers 114 from the n-type semiconductor side to the p-type semiconductor side are, for example, $y1, y2, \ldots,$ and $yk$, respectively. The mole fractions of aluminum of the intermediate level layers 114 from the n-type semiconductor side to the p-type semiconductor side are, for example, $z1, z2, \ldots,$ and $zk$. In this embodiment, the multiple quantum well structure 100 may satisfy at least one of the following conditions:

$Lx1>Lx2>\ldots>Lxk;$ $Ly1<Ly2<\ldots<Lyk;$ $0<x1<x2<\ldots<xk<1;$ $1>y1>y2>\ldots>yk>0;$ $5\ nm>Lx1+Ly1=Lx2+Ly2=\ldots=Lxk+Lyk>1\ nm;$ $Lx1>Ly1, Lx2>Ly2, \ldots,$ and $Lxk>Lyk;$ $x1>y1, x2>y2, \ldots,$ and $xk>yk;$ and $1>z1>z2>\ldots>zk>0.$ Referring to FIGS. 2A and 2B again, in an embodiment, the barrier layer 112 is made of a binary compound (e.g. GaN), the well layer 116 is made of a ternary compound (e.g. InGaN), and the intermediate level layer is made of a quaternary compound (e.g. indium aluminum gallium nitride (InAlGaN)). Each of the ternary compound (e.g. InGaN) and the quaternary compound (e.g. InAlGaN) has a first element (e.g. indium) which the binary compound (e.g. GaN) does not have. The mole fraction of the first element (e.g. indium) in the at least parts of the well layers 116 gradually increases along the direction x, and the mole fraction of the first element (e.g. indium) in the at least parts of the intermediate level layers 114 gradually decreases along the direction x.

In this embodiment, the quaternary compound (e.g. InAlGaN) has a second element (e.g. aluminum) which both the binary compound (e.g. GaN) and the ternary compound (e.g. InGaN) do not have, and the mole fraction of the second element (e.g. aluminum) in the at least parts of the intermediate level layers 114 gradually decreases along the direction x. In this embodiment, the multiple quantum well structure 100a may also satisfy at least one condition of the aforementioned multiple quantum well structure 100 adopting the intermediate level layers 114 made of InAlGaN.

Figure 3:
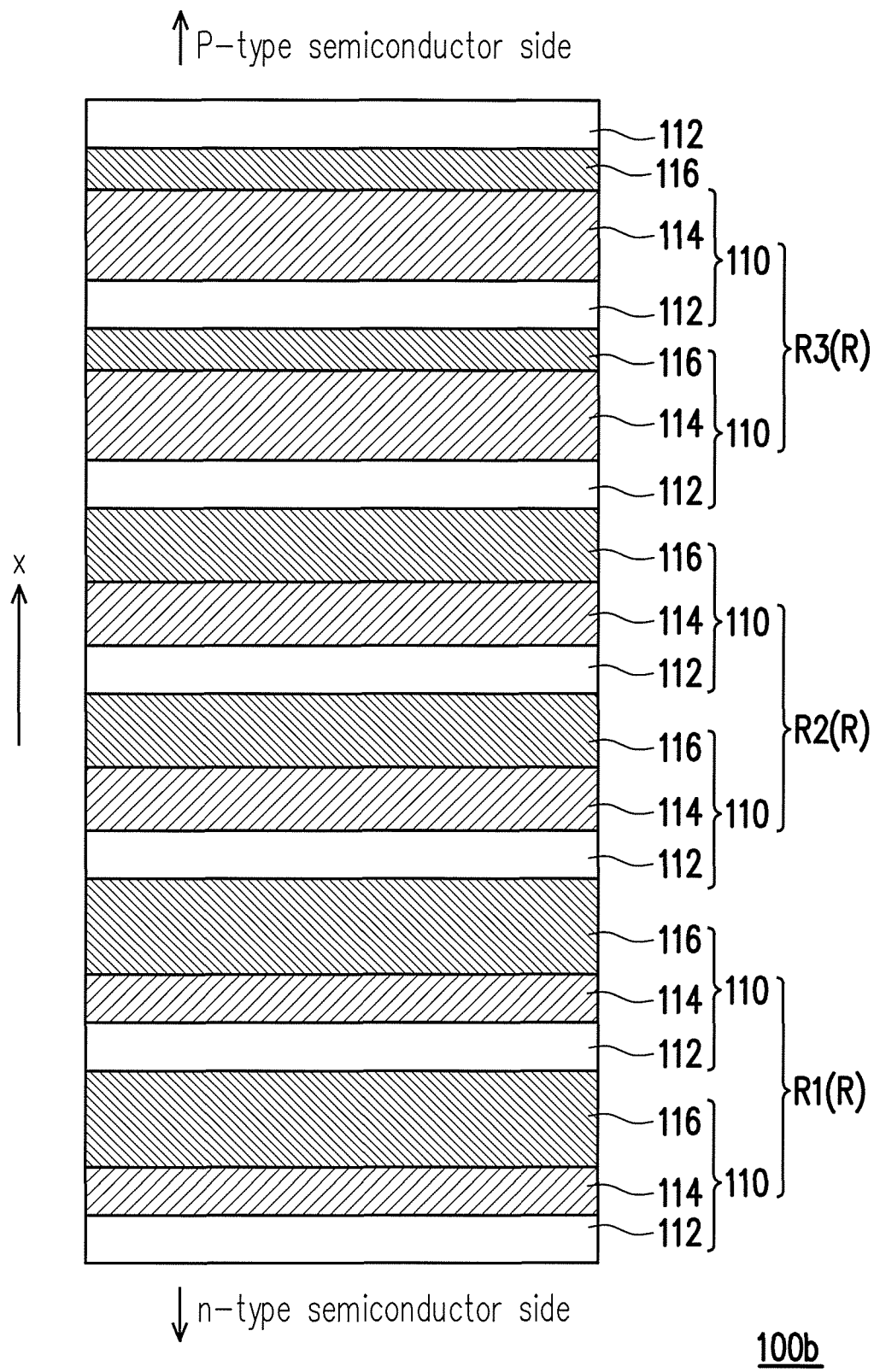
FIG. 3 is a schematic view of a multiple quantum well structure according to another embodiment of the invention.

FIG. 3 is a schematic view of a multiple quantum well structure according to another embodiment of the invention. Referring to FIG. 3, the multiple quantum well structure 100b in this embodiment is similar to the multiple quantum well structure 100 in FIG. 1A, and the main difference is as follows. In the multiple quantum well structure 100b, at least parts of the well-barrier sets 110 are grouped into a plurality of groups R (e.g. the group R1, the group R2, and the group R3), and each of the groups R includes a plurality of adjacent well-barrier sets 110. Thicknesses of the well layers 116 in the direction x in the same group R are substantially the same, and thicknesses of the well layers 116 in the direction x in different groups R gradually decrease along the direction x. For example, the thicknesses of the well layers 116 in the group R1 are substantially the same, and the thicknesses of the well layers 116 in the groups R1 and R2 may be deduced by analogy. In addition, the thickness of each well layer 116 in the group R1 is greater than the thickness of each well layer 116 in the group R2, and the thickness of each well layer 116 in the group R2 is greater than the thickness of each well layer 116 in the group R3. Besides, thicknesses of the intermediate level layers 114 in the direction x in the same group R are substantially the same, and thicknesses of the intermediate level layers 114 in the direction x in different groups R gradually increase along the direction x. For example, the thicknesses of the intermediate level layers 114 in the group R1 are substantially the same, and the thicknesses of the intermediate level layers 114 in the groups R1 and R2 may be deduced by analogy. In addition, the thickness of each intermediate level layer 114 in the group R1 is less than the thickness of each intermediate level layer 114 in the group R2, and the thickness of each intermediate level layer 114 in the group R2 is less than the thickness of each well layer 114 in the group R3.

In this embodiment, the direction x is from the n-type semiconductor layer to the p-type semiconductor layer. However, in some other embodiments, the direction x may be from the p-type semiconductor layer to the n-type semiconductor layer.

In this embodiment, the barrier layer 112 is made of a binary compound (e.g. GaN), both the intermediate level layer 114 and the well layer 116 are made of ternary compounds (e.g. InGaN), each of the ternary compounds (e.g. InGaN) has an element (e.g. indium) which the binary compound does not have. The mole fraction of the element (e.g. indium) in the well layers 116 in the same group R is substantially the same, and the mole fraction of the element (e.g. indium) in the well layers 116 in different groups R gradually increases along the direction x. In addition, the mole fraction of the element (e.g. indium) in the intermediate level layers 114 in the same group R is substantially the same, and the mole fraction of the element (e.g. indium) in the intermediate level layers 114 in different groups R gradually decreases along the direction x. Besides, in this embodiment, in each of the well-barrier sets 110, the mole fraction of the element (e.g. indium) in the well layer 116 is greater than the mole fraction of the element (e.g. indium) in the intermediate level layer 114.

In the multiple quantum well structure 100b, the intermediate level layers 114 and the well layers 116 vary group by group.

Referring to FIG. 3 again, in an embodiment, the barrier layer 112 is made of a binary compound (e.g. GaN), the well layer 116 is made of a ternary compound (e.g. InGaN), and the intermediate level layer 114 is made of a quaternary compound (e.g. InAlGaN). Each of the ternary compound (e.g. InGaN) and the quaternary compound (e.g. InAlGaN) has a first element (e.g. indium) which the binary compound does not have. The mole fraction of the first element (e.g. indium) in the well layers 116 in the same group R is substantially the same, and the mole fraction of the first element (e.g. indium) in the well layers 116 in different groups R gradually increases along the direction x. The mole fraction of the first element (e.g. indium) in the intermediate level layers 114 in the same group R is substantially the same, and the mole fraction of the first element (e.g. indium) in the intermediate level layers 114 in different groups R gradually decreases along the direction x.

In this embodiment, the quaternary compound (e.g. InAlGaN) has a second element (e.g. aluminum) which both the binary compound (e.g. GaN) and the ternary compound (e.g. InGaN) do not have. The mole fraction of the second element (e.g. aluminum) in the intermediate level layers 114 in the same group R is substantially the same, and the mole fraction of the second element (e.g. aluminum) in the intermediate level layers 114 in different groups R gradually decreases along the direction x.

Figure 4:
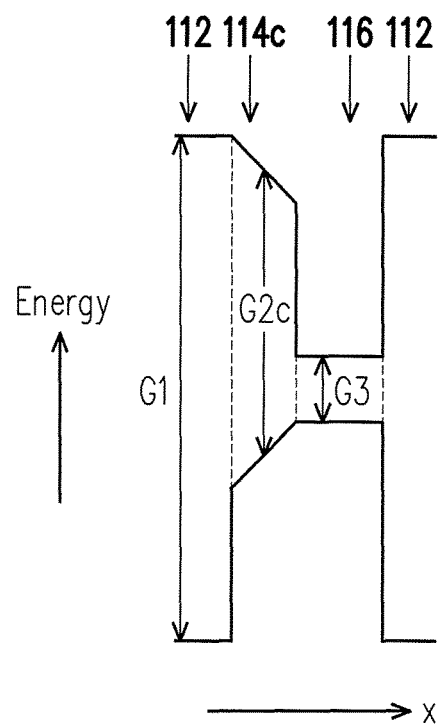
FIG. 4 is a band diagram corresponding to a well-barrier set of a multiple quantum well structure according to another embodiment of the invention.

FIG. 4 is a band diagram corresponding to a well-barrier set of a multiple quantum well structure according to another embodiment of the invention. Referring to FIG. 4, the multiple quantum well structure in this embodiment is similar to the multiple quantum well structure 100 in FIGS. 1A and 1B, and the main difference is as follows. In this embodiment, the bandgap G2c of each of the intermediate level layers 114c gradually decreases from a side adjacent to an adjacent barrier layer 112 to a side adjacent to an adjacent well layer 116.

Figure 5:
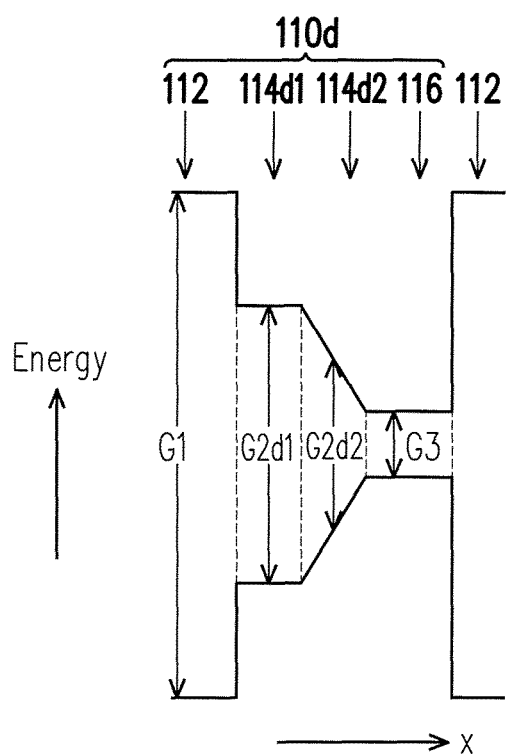
FIG. 5 is a band diagram corresponding to a well-barrier set of a multiple quantum well structure according to another embodiment of the invention.

FIG. 5 is a band diagram corresponding to a well-barrier set of a multiple quantum well structure according to another embodiment of the invention. Referring to FIG. 5, the multiple quantum well structure in this embodiment is similar to the multiple quantum well structure 100 in FIGS. 1A and 1B, and the main difference is as follows. In this embodiment, each well-barrier set 110d includes a plurality of intermediate level layers 114d1 and 114d2 disposed beside the barrier layer 112 and the well layer 116. The average bandgap G2d1 of the intermediate level layer 114d1 is less than the bandgap G1 of the barrier layer 112 and greater than the bandgap G3 of the well layer 116. In this embodiment, the bandgap G2d2 of each of the intermediate level layers 114d2 gradually decreases from a side adjacent to an adjacent barrier layer 112 to a side adjacent to an adjacent well layer 116.

Figure 6:
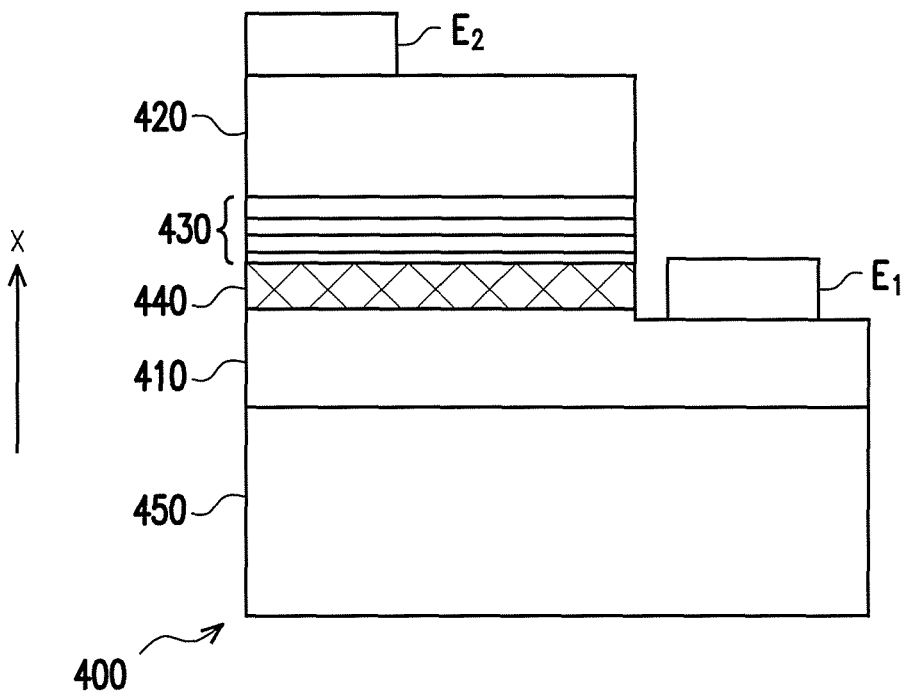
FIG. 6 is a schematic view of a light emitting device according to an embodiment of the invention.

FIG. 6 is a schematic view of a light emitting device according to an embodiment of the invention. Referring to FIGS. 1A and 6, a light emitting device 400 of the present embodiment is a horizontal-type light emitting device. The light emitting device 400 includes a substrate 450, a first type doped semiconductor layer 410, a light emitting layer 430, a second type doped semiconductor layer 420, a first electrode E1 and a second electrode E2. The first electrode E1 and the second electrode E2 are disposed facing the same side. The light emitting layer 430 is disposed on the first type doped semiconductor layer 410 and the second type doped semiconductor layer 420 is disposed on the light emitting layer 430, which means that the light emitting layer 430 is located between the first type doped semiconductor layer 410 and the second type doped semiconductor layer 420. Specifically, the first type doped semiconductor layer 410 is, for example, an n-type semiconductor layer, and the second type doped semiconductor layer 420 is, for example, a p-type semiconductor layer. The n-type semiconductor layer and the p-type semiconductor layer may be formed of at least one of GaN, AlGaN, InGaN and AlInGaN by doping group II elements or doping group IV elements. The present embodiment is described using GaN as an example. However, in other embodiments, the first type doped semiconductor layer 410 may be a p-type semiconductor layer and the second type doped semiconductor layer 420 may be an n-type semiconductor layer.

Still referring to FIG. 6, in the light emitting device 400, the light emitting layer 430 may be any one of the aforementioned multiple quantum well structures 100, 100a, and 100b and the multiple quantum well structures described in the embodiments of FIGS. 4 and 5 and other embodiments. That is, the first type doped semiconductor layer 410 (such as an n-type semiconductor layer) and the second type doped semiconductor layer 420 (such as a p-type semiconductor layer) are respectively disposed at two opposite sides of the plurality of well-barrier sets 110.

In addition, in the present embodiment, the light emitting device 400 further includes a superlattice layer 440 disposed between the first type doped semiconductor layer 410 (such as an n-type semiconductor layer) and the light emitting layer 430. The superlattice layer 440 is a superlattice structure formed by alternately disposing an AlInGaN layer and a GaN layer, which conduces to a reduction in density of the dislocation defects caused by the release of stress of the epitaxial structure.

Figure 7:
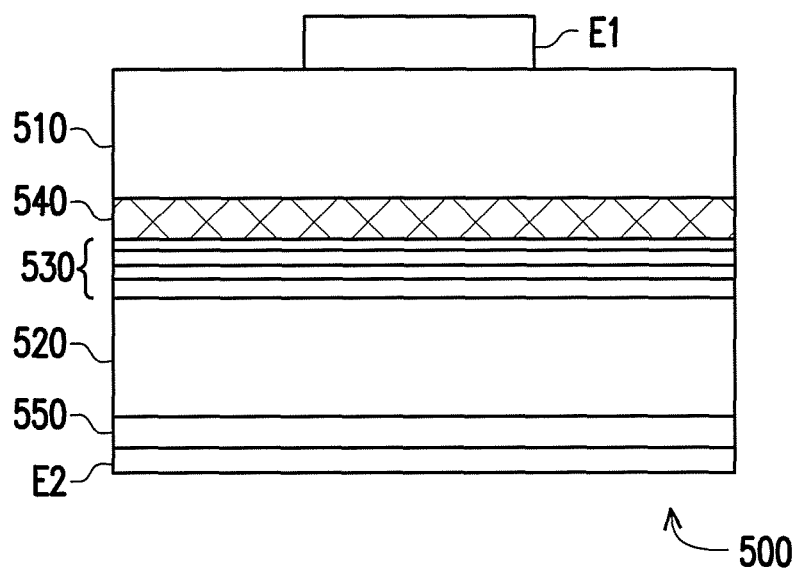
FIG. 7 is a schematic view of a light emitting device according to another embodiment of the invention.

FIG. 7 is a schematic view of a light emitting device according to another embodiment of the invention. The light emitting device 500 of the present embodiment includes a first type doping semiconductor 510 (such as an n-type semiconductor layer), a light emitting layer 530, a second type doped semiconductor layer 520 (such as a p-type semiconductor layer), a first electrode E1 and a second electrode E2. It is known from FIG. 7 that the light emitting device 500 is a vertical-type light emitting device. Thus the first electrode E1 is disposed at another side of the first type doped semiconductor layer 510 (such as an n-type semiconductor layer), and the first type doped semiconductor layer 510 (such as an n-type semiconductor layer) is located between the light emitting layer 530 and the first electrode E1. In the present embodiment, the light emitting device 500 includes a conductive substrate 550 disposed between the second type doped semiconductor layer 520 (such as a p-type semiconductor layer) and the second electrode E2. The light emitting layer 530 may be any one of the aforementioned multiple quantum well structures 100, 100a, and 100b and the multiple quantum well structures described in the embodiments of FIGS. 4 and 5 and other embodiments. In addition, in the present embodiment, the light emitting device 500 also further includes a superlattice layer 540 disposed between the first type doped semiconductor layer 510 (such as an n-type semiconductor layer) and the light emitting layer 530. The effects of the superlattice layer 540 may be derived by referring to the above descriptions.

Referring to FIG. 1A again, an embodiment of the invention provides a method for manufacturing a multiple quantum well structure, and the multiple quantum well structure may be any one of the aforementioned multiple quantum well structures 100, 100a, and 100b and the multiple quantum well structures described in the embodiments of FIGS. 4 and 5 and other embodiments. The multiple quantum well structure 100 is taken as an example hereinafter. The method for manufacturing the multiple quantum well structure 100 includes forming a plurality of well-barrier sets 110, wherein the formed well-barrier sets 110 are arranged along a direction x. The method of forming the well-barrier sets 110 may include chemical vapor deposition (CVD), e.g. metalorganic chemical vapor deposition (MOCVD), physical vapor deposition, molecular beam epitaxy (MBE), or any other appropriate semiconductor epitaxial method. Forming each of the well-barrier sets 110 includes forming a barrier layer 112, forming at least one intermediate level layer 114, and forming a well layer 116. The coefficients of the multiple quantum well structure 100 have been described hereinbefore, which will not be repeated hereinafter.

Referring FIG. 4 again, when the intermediate level layer 114c is formed, the amount of indium is gradually increased with time, so that the bandgap G2c of each of the intermediate level layer 114c gradually decreases from the side adjacent to an adjacent barrier layer 112 to the side adjacent to an adjacent well layer 116.

In summary, in the multiple quantum well structure and the method for manufacturing the multiple quantum well structure according to the embodiments of the invention, thicknesses of at least parts of the well layers in the direction gradually decrease along the direction and thicknesses of at least parts of the intermediate level layers in the direction gradually increase along the direction, or thicknesses of the well layers in the direction in different groups gradually decrease along the direction and thicknesses of the intermediate level layers in the direction in different groups gradually increase along the direction. As a result, the stress accumulated in the multiple quantum well structure is reduced, and the wavelength of light emitted from different well-barrier sets is similar or the same. Therefore, the multiple quantum well structure has both good epitaxial quality and a good optical property.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A multiple quantum well structure comprising:
   a plurality of well-barrier sets stacked repeatedly along a direction, each of the well-barrier sets comprising following layers disposed in sequence:
   a barrier layer;
   at least one intermediate level layer; and
   a well layer, wherein a bandgap of the barrier layer is greater than an average bandgap of the intermediate level layer, and the average bandgap of the intermediate level layer is greater than a bandgap of the well layer,
   wherein thicknesses of at least parts of the well layers in the direction gradually decrease along the direction, thicknesses of at least parts of the intermediate level layers in the direction gradually increase along the direction, and the thickness of the intermediate level layer plus the thickness of the well layer in each of the well-barrier sets is substantially the same.

2. The multiple quantum well structure as claimed in claim 1, wherein an n-type semiconductor layer and a p-type semiconductor layer are respectively disposed at two opposite sides of the well-barrier sets, and the direction is from the n-type semiconductor layer to the p-type semiconductor layer.

3. The multiple quantum well structure as claimed in claim 1, wherein an n-type semiconductor layer and a p-type semiconductor layer are respectively disposed at two opposite sides of the well-barrier sets, and the direction is from the p-type semiconductor layer to the n-type semiconductor layer.

4. The multiple quantum well structure as claimed in claim 1, wherein the barrier layer is made of a binary compound, both the intermediate level layer and the well layer are made of ternary compounds, each of the ternary compounds has an element which the binary compound does not have, a mole fraction of the element in the at least parts of the well layers gradually increases along the direction, and a mole fraction of the element in the at least parts of the intermediate level layers gradually decreases along the direction.

5. The multiple quantum well structure as claimed in claim 4, wherein in each of the well-barrier sets, the mole fraction of the element in the well layer is greater than the mole fraction of the element in the intermediate level layer.

6. The multiple quantum well structure as claimed in claim 4, wherein the barrier layer is made of gallium nitride, both the intermediate level layer and the well layer are made of indium gallium nitride, a mole fraction of indium in the at least parts of the well layers gradually increases along the direction, and a mole fraction of indium in the at least parts of the intermediate level layers gradually decreases along the direction.

7. The multiple quantum well structure as claimed in claim 1, wherein the barrier layer is made of a binary compound, the well layer is made of a ternary compound, the intermediate level layer is made of a quaternary compound, each of the ternary compound and the quaternary compound has a first element which the binary compound does not have, a mole fraction of the first element in the at least parts of the well layers gradually increases along the direction, and a mole fraction of the first element in the at least parts of the intermediate level layers gradually decreases along the direction.

8. The multiple quantum well structure as claimed in claim 7, wherein the quaternary compound has a second element which both the binary compound and the ternary compound do not have, and a mole fraction of the second element in the at least parts of the intermediate level layers gradually decreases along the direction.

9. The multiple quantum well structure as claimed in claim 7, wherein the binary compound is gallium nitride, the ternary compound is indium gallium nitride, the quaternary compound is indium aluminum gallium nitride, the first element is indium, and the second element is aluminum.

10. The multiple quantum well structure as claimed in claim 1, wherein the thickness of the intermediate level layer plus the thickness of the well layer in each of the well-barrier sets is greater than 1 nanometer (nm) and less than 5 mn.

11. The multiple quantum well structure as claimed in claim 1, wherein the number of the well-barrier sets is greater than 2 and less than 20.

12. The multiple quantum well structure as claimed in claim 1, wherein in each of the well-barrier sets, the thickness of the well layer is greater than the thickness of the intermediate level layer.

13. The multiple quantum well structure as claimed in claim 1, wherein the bandgap of each of the intermediate level layers gradually decreases from a side adjacent to an adjacent barrier layer to a side adjacent to an adjacent well layer.

14. A multiple quantum well structure comprising:
   a plurality of well-barrier sets stacked repeatedly along a direction, each of the well-barrier sets comprising following layers disposed in sequence:
   a barrier layer;
   at least one intermediate level layer; and
   a well layer, wherein a bandgap of the barrier layer is greater than an average bandgap of the intermediate level layer, and the average bandgap of the intermediate level layer is greater than a bandgap of the well layer,
   wherein at least parts of the well-barrier sets are grouped into a plurality of groups, each of the groups comprises a plurality of adjacent well-barrier sets, thicknesses of the well layers in the direction in the same group are substantially the same, thicknesses of the well layers in the direction in different groups gradually decrease along the direction, thicknesses of the intermediate level layers in the direction in the same group are substantially the same, thicknesses of the intermediate level layers in the direction in different groups gradually increase along the direction, the thickness of the intermediate level layer plus the thickness of the well layer in each of the well-barrier sets is substantially the same.

15. The multiple quantum well structure as claimed in claim 14, wherein an n-type semiconductor layer and a p-type semiconductor layer are respectively disposed at two opposite sides of the well-barrier sets, and the direction is from the n-type semiconductor layer to the p-type semiconductor layer.

16. The multiple quantum well structure as claimed in claim 14, wherein an n-type semiconductor layer and a p-type semiconductor layer are respectively disposed at two opposite sides of the well-barrier sets, and the direction is from the p-type semiconductor layer to the n-type semiconductor layer.

17. The multiple quantum well structure as claimed in claim 14, wherein the barrier layer is made of a binary compound, both the intermediate level layer and the well layer are made of ternary compounds, each of the ternary compounds has an element which the binary compound does not have, a mole fraction of the element the well layers in the same group is substantially the same, a mole fraction of the element in the well layers in different groups gradually increases along the direction, a mole fraction of the element in the intermediate level layers in the same group is substantially the same, and a mole fraction of the element in the intermediate level layers in different groups gradually decreases along the direction.

18. The multiple quantum well structure as claimed in claim 17, wherein in each of the well-barrier sets, the mole fraction of the element in the well layer is greater than the mole fraction of the element in the intermediate level layer.

19. The multiple quantum well structure as claimed in claim 17, wherein the barrier layer is made of gallium nitride, both the intermediate level layer and the well layer are made of indium gallium nitride, a mole fraction of indium in the well layers in the same group is substantially the same, a mole fraction of indium in the well layers in different groups gradually increases along the direction, a mole fraction of indium in the intermediate level layers in the same group is substantially the same, and a mole fraction of indium in the intermediate level layers in different groups gradually decreases along the direction.

20. The multiple quantum well structure as claimed in claim 14, wherein the barrier layer is made of a binary compound, the well layer is made of a ternary compound, the intermediate level layer is made of a quaternary compound, each of the ternary compound and the quaternary compound has a first element which the binary compound does not have, a mole fraction of the first element in the well layers in the same group is substantially the same, a mole fraction of the first element in the well layers in different groups gradually increases along the direction, a mole fraction of the first element in the intermediate level layers in the same group is substantially the same, and a mole fraction of the first element in the intermediate level layers in different groups gradually decreases along the direction.

21. The multiple quantum well structure as claimed in claim 20, wherein the quaternary compound has a second element which both the binary compound and the ternary compound do not have, a mole fraction of the second element in the intermediate level layers in the same group is substantially the same, and a mole fraction of the second element in the intermediate level layers in different groups gradually decreases along the direction.

22. The multiple quantum well structure as claimed in claim 20, wherein the binary compound is gallium nitride, the ternary compound is indium gallium nitride, the quaternary compound is indium aluminum gallium nitride, the first element is indium, and the second element is aluminum.

23. The multiple quantum well structure as claimed in claim 14, wherein the thickness of the intermediate level layer plus the thickness of the well layer in each of the well-barrier sets is greater than 1 nm and less than 5 nm.

24. The multiple quantum well structure as claimed in claim 14, wherein in each of the well-barrier sets, the thickness of the well layer is greater than the thickness of the intermediate level layer.

25. The multiple quantum well structure as claimed in claim 14, wherein the bandgap of each of the intermediate level layers gradually decreases from a side adjacent to an adjacent barrier layer to a side adjacent to an adjacent well layer.

26. A method for manufacturing a multiple quantum well structure comprising:
    forming a plurality of well-barrier sets stacked repeatedly along a direction, wherein each of the well-barrier sets comprises following layers in sequence:
    a barrier layer;
    at least one intermediate level layer; and
    a well layer, wherein a bandgap of the barrier layer is greater than an average bandgap of the intermediate level layer, and the average bandgap of the intermediate level layer is greater than a bandgap of the well layer,
    wherein thicknesses of at least parts of the well layers in the direction gradually decrease along the direction, thicknesses of at least parts of the intermediate level layers in the direction gradually increase along the direction, and the thickness of the intermediate level layer plus the thickness of the well layer in each of the well-barrier sets is substantially the same.

27. The method for manufacturing the multiple quantum well structure as claimed in claim 26, wherein an n-type semiconductor layer and a p-type semiconductor layer are respectively at two opposite sides of the well-barrier sets, and the direction is from the n-type semiconductor layer to the p-type semiconductor layer.

28. The method for manufacturing the multiple quantum well structure as claimed in claim 26, wherein an n-type semiconductor layer and a p-type semiconductor layer are respectively at two opposite sides of the well-barrier sets, and the direction is from the p-type semiconductor layer to the n-type semiconductor layer.

29. The method for manufacturing the multiple quantum well structure as claimed in claim 26, wherein the barrier layer is made of a binary compound, both the intermediate level layer and the well layer are made of ternary compounds, each of the ternary compounds has an element which the binary compound does not have, a mole fraction of the element in the at least parts of the well layers gradually increases along the direction, and a mole fraction of the element in the at least parts of the intermediate level layers gradually decreases along the direction.

30. The method for manufacturing the multiple quantum well structure as claimed in claim 29, wherein in each of the well-barrier sets, the mole fraction of the element in the well layer is greater than the mole fraction of the element in the intermediate level layer.

31. The method for manufacturing the multiple quantum well structure as claimed in claim 29, wherein the barrier layer is made of gallium nitride, both the intermediate level layer and the well layer are made of indium gallium nitride, a mole fraction of indium in the at least parts of the well layers gradually increases along the direction, and a mole fraction of indium in the at least parts of the intermediate level layers gradually decreases along the direction.

32. The method for manufacturing the multiple quantum well structure as claimed in claim 26, wherein the barrier layer is made of a binary compound, the well layer is made of a ternary compound, the intermediate level layer is made of a quaternary compound, each of the ternary compound and the quaternary compound has a first element which the binary compound does not have, a mole fraction of the first element in the at least parts of the well layers gradually increases along the direction, and a mole fraction of the first element in the at least parts of the intermediate level layers gradually decreases along the direction.

33. The method for manufacturing the multiple quantum well structure as claimed in claim 32, wherein the quaternary compound has a second element which both the binary compound and the ternary compound do not have, and a mole fraction of the second element in the at least parts of the intermediate level layers gradually decreases along the direction.

34. The method for manufacturing the multiple quantum well structure as claimed in claim 32, wherein the binary compound is gallium nitride, the ternary compound is indium gallium nitride, the quaternary compound is indium aluminum gallium nitride, the first element is indium, and the second element is aluminum.

35. The method for manufacturing the multiple quantum well structure as claimed in claim 26, wherein the thickness of the intermediate level layer plus the thickness of the well layer in each of the well-barrier sets is greater than 1 nm and less than 5 nm.

36. The method for manufacturing the multiple quantum well structure as claimed in claim 26, wherein the number of the well-barrier sets is greater than 2 and less than 20.

37. The method for manufacturing the multiple quantum well structure as claimed in claim 26, wherein in each of the well-barrier sets, the thickness of the well layer is greater than the thickness of the intermediate level layer.

38. The method for manufacturing the multiple quantum well structure as claimed in claim 26, wherein the bandgap of each of the intermediate level layers gradually decreases from a side adjacent to an adjacent barrier layer to a side adjacent to an adjacent well layer.

* * * * *